(12) United States Patent
Wakabayashi et al.

(10) Patent No.: US 12,075,563 B2
(45) Date of Patent: Aug. 27, 2024

(54) MULTILAYER PRINTED CIRCUIT BOARD AND ELECTRONIC DEVICE

(71) Applicant: Sony Interactive Entertainment Inc., Tokyo (JP)

(72) Inventors: Minoru Wakabayashi, Tokyo (JP); Yosuke Maki, Tokyo (JP); Yuito Tsuji, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 281 days.

(21) Appl. No.: 17/783,078

(22) PCT Filed: Sep. 24, 2020

(86) PCT No.: PCT/JP2020/036097
§ 371 (c)(1),
(2) Date: Jun. 7, 2022

(87) PCT Pub. No.: WO2021/117313
PCT Pub. Date: Jun. 17, 2021

(65) Prior Publication Data
US 2023/0022992 A1 Jan. 26, 2023

(30) Foreign Application Priority Data
Dec. 12, 2019 (JP) .................................. 2019-224857

(51) Int. Cl.
*H05K 1/02* (2006.01)
*H05K 1/05* (2006.01)
(Continued)

(52) U.S. Cl.
CPC .............. *H05K 1/0298* (2013.01); *H05K 1/05* (2013.01); *H05K 1/09* (2013.01); *H05K 3/46* (2013.01); *H05K 2201/10098* (2013.01)

(58) Field of Classification Search
CPC ................... H05K 1/0298; H05K 1/05; H05K 2201/10098
See application file for complete search history.

(56) References Cited

U.S. PATENT DOCUMENTS 4,777,718 A * 10/1988 Henderson ............. H05K 1/167
338/307
6,181,278 B1 1/2001 Kakimoto
(Continued)

FOREIGN PATENT DOCUMENTS

CN 101222815 A 7/2008
CN 102131342 A 7/2011
(Continued)

OTHER PUBLICATIONS

International Search Report for corresponding PCT Application No. PCT/JP2020/036097, 4 pages, dated Dec. 8, 2020.
(Continued)

*Primary Examiner* — Sherman Ng
(74) *Attorney, Agent, or Firm* — Matthew B. Dernier, Esq.

(57) ABSTRACT

A multilayer printed circuit board includes a plurality of conductive layers formed by a conductive material, in which a blank region with the conductive material removed is formed in at least part of at least an intermediate conductive layer that is formed inside the multilayer printed circuit board, among the plurality of conductive layers, a plurality of island regions are formed by the conductive material included in the intermediate conductive layer in the blank region, and each of the plurality of island regions is not electrically connected to other regions included in the intermediate conductive layer and is disposed so as to be dispersed from one another.

8 Claims, 4 Drawing Sheets

(51) Int. Cl.
    *H05K 1/09*    (2006.01)
    *H05K 3/46*    (2006.01)

(56) References Cited

U.S. PATENT DOCUMENTS

| | | | |
|---|---|---|---|
| 6,469,256 B1* | 10/2002 | Miller | H05K 3/4069 |
| | | | 174/255 |
| 9,306,268 B2 | 4/2016 | Hwang | |
| 2008/0144295 A1 | 6/2008 | Wang | |
| 2014/0266924 A1 | 9/2014 | Hwang | |
| 2017/0055339 A1* | 2/2017 | Zhang | H05K 1/0373 |
| 2019/0166690 A1 | 5/2019 | Yamamoto | |
| 2019/0288403 A1* | 9/2019 | Clemente | H01Q 21/22 |

FOREIGN PATENT DOCUMENTS

| | | |
|---|---|---|
| CN | 104051844 A | 9/2014 |
| JP | 58171896 A | 10/1983 |
| JP | 10270936 A | 10/1998 |
| JP | 11233938 A | 8/1999 |
| JP | 2004237620 A | 8/2004 |
| JP | 2004327620 A | 11/2004 |
| WO | 2018030192 A1 | 2/2018 |

OTHER PUBLICATIONS

Notice of Reasons for Refusal for corresponding JP Application No. JP2021-563755, 5 pages dated Mar. 22, 2023.
The First Office Action for corresponding CN Application No. 202080084374.X, 17 pages, dated Feb. 29, 2024.

\* cited by examiner

MULTILAYER PRINTED CIRCUIT BOARD AND ELECTRONIC DEVICE

TECHNICAL FIELD

The present invention relates to a multilayer printed circuit board and an electronic device incorporating the same.

BACKGROUND ART

In general, an electronic device incorporates a printed circuit board mounted with various types of electronic components on its front surface. Among such a printed circuit board, there is provided a multilayer printed circuit board having conductive layers formed by conductive materials not only on its front surface, but also internally.

SUMMARY

Technical Problems

In the above-described technique, there may be a case in which a region in which a conductive material is not disposed in a relatively wider range (referred to as a blank region, hereinafter) needs to be formed in a conductive layer inside a multilayer printed circuit board. For example, depending on a layout of an antenna in an electronic device, or the like, the conductive layer formed in the multilayer printed circuit board may interfere with propagation of a radio signal that is transmitted and received by the antenna. In such a case, there is a need to form a blank region with the conductive material removed from the conductive layer of the multilayer printed circuit board.

In the case of forming a multilayer printed circuit board having such a blank region formed in a conductive layer inside the multilayer printed circuit board, for example, the blank region is formed by removing part of the conductive material through an etching process or the like from the conductive layer formed by attaching a copper foil on a front surface of a core member, or the like. Then, an insulating layer is formed by a process of providing a layered insulating material containing resin, such as a prepreg, onto an upper side of the conductive layer formed with the blank region, and applying pressure and heat thereto, or other processes.

At this time, in a case in which the blank region has a wide range, a flow of the insulating material is generated from a peripheral region of the blank region toward the blank region upon forming the insulating layer, thereby causing wrinkles or the like on a front surface of the insulating layer. As a result, the front surface of the insulating layer may not be able to be made flat, in some cases. Particularly in a case in which an insulating layer small in thickness is formed, an amount of an insulating material to be filled is small, and an influence of the blank region becomes relatively large. Accordingly, such a problem is likely to occur.

The present invention has been made in view of the above-described circumstances, and one of objects of the present invention is to provide a multilayer printed circuit board having a blank region filled with an insulating material formed inside a conductive layer inside the board, and an electronic device incorporating the multilayer printed circuit board.

Solution to Problem

A multilayer printed circuit board according to an aspect of the present invention includes a plurality of conductive layers formed by a conductive material, in which a blank region with the conductive material removed is formed in at least part of at least an intermediate conductive layer that is formed inside the multilayer printed circuit board, among the plurality of conductive layers, a plurality of island regions are formed by the conductive material included in the intermediate conductive layer in the blank region, and each of the plurality of island regions is not electrically connected to other regions included in the intermediate conductive layer and is disposed so as to be dispersed from one another. In addition, an electronic device according to an aspect of the present invention includes the multilayer printed circuit board.

DESCRIPTION OF EMBODIMENT

Hereinafter, an embodiment of the present invention will be described in detail with reference to the accompanying drawings.

Figure 1:
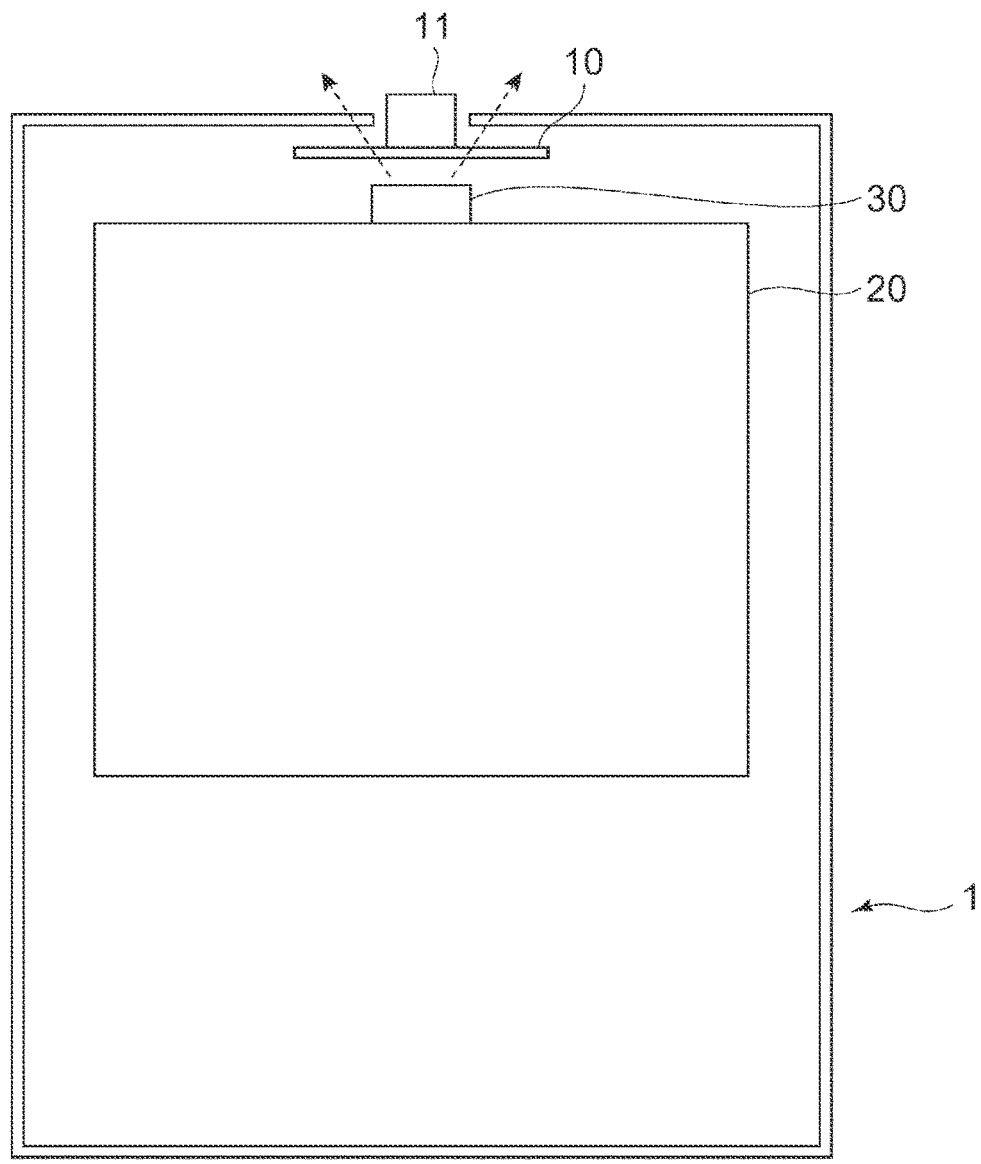
FIG. 1 is a view illustrating a state inside an electronic device according to an embodiment of the present invention.

FIG. 1 is a plan view illustrating a state inside an electronic device 1 according to an embodiment of the present invention. The electronic device 1 is, for example, a home game device or the like, and as illustrated in FIG. 1, includes a multilayer printed circuit board 10, a main board 20, and an antenna 30.

The multilayer printed circuit board 10 is disposed along a vertical plane in such a manner that a front surface of the multilayer printed circuit board 10 faces a front side of the electronic device 1 and has an operation button 11 disposed on the front surface thereof. The operation button 11 is exposed on the front side of the electronic device 1 and can be operated by a user of the electronic device 1, from the front side. Details of a structure of the multilayer printed circuit board 10 will be described later.

The main board 20 is disposed along a horizontal plane inside the electronic device 1 and has various types of circuit elements required for operating the electronic device 1 disposed on a front surface thereof. In addition, the antenna 30 is connected to the main board 20.

The antenna 30 is a conductive member that transmits and receives a radio signal (electromagnetic wave) in a predetermined frequency band and used for carrying out wireless communication between the electronic device 1 and another communication device. The antenna 30 may be a sheet metal antenna or the like. In the present embodiment, the antenna 30 is disposed between the main board 20 and the multilayer printed circuit board 10, in plan view, and is concealed behind the multilayer printed circuit board 10 as viewed from the front side of the electronic device 1. Accordingly, at least part of the electromagnetic wave radiated from the antenna 30 in a direction toward the front side of the electronic device 1 passes through the multilayer printed circuit board 10, as illustrated with a broken arrow in the figure.

Figure 2:
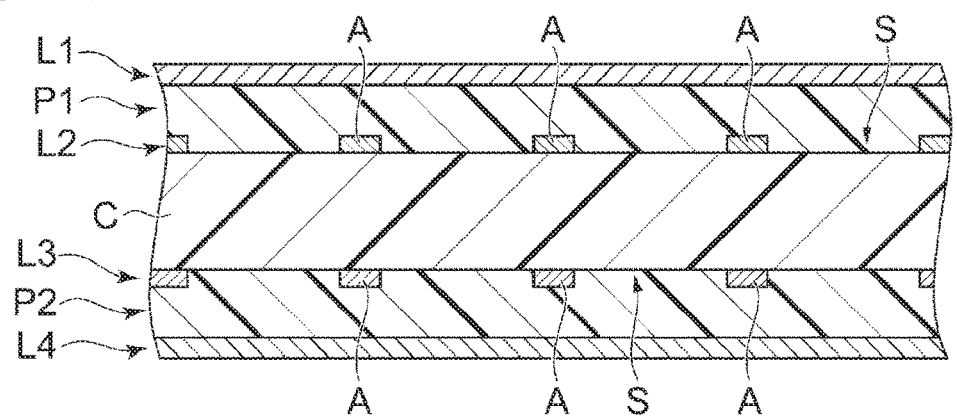
FIG. 2 is a schematic cross-sectional view illustrating a multilayer printed circuit board according to the embodiment of the present invention.
Figure 3:
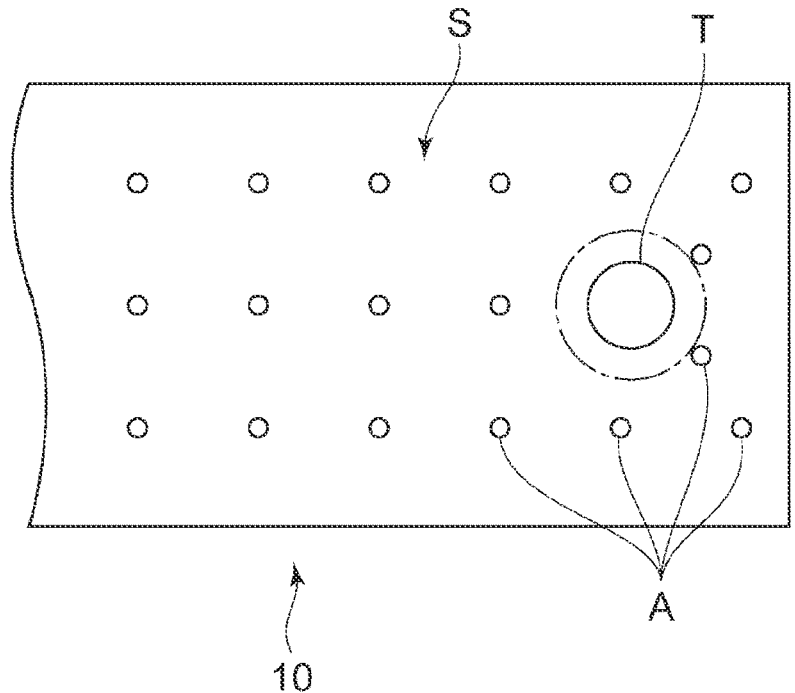
FIG. 3 is a plan view illustrating an example of a conductive layer inside the multilayer printed circuit board according to the embodiment of the present invention.

In the following, a structure of the multilayer printed circuit board 10 will be described with reference to FIG. 2 and FIG. 3. FIG. 2 illustrates a schematic sectional shape of the multilayer printed circuit board 10, and FIG. 3 illustrates an example of a planer shape of a conductive layer inside the multilayer printed circuit board 10.

In the present embodiment, the multilayer printed circuit board 10 includes four conductive layers in total, a conductive layer L1 on its front surface, a conductive layer L4 on its back surface, and conductive layers L2 and L3 (intermediate conductive layers) disposed between the conductive layers L1 and L4 inside the multilayer printed circuit board 10. The conductive layers L2 and L3 are disposed on either side of a core member C, and an insulating layer P1 and an insulating layer P2 are formed between the conductive layers L1 and L2 and between the conductive layers L3 and L4, respectively. Each of the conductive layers is formed by a conductive material such as a copper foil, and each of the insulating layers is formed by an insulating material such a prepreg.

As mentioned above, for the antenna 30 to carry out wireless communication with another communication device in front of the electronic device 1, the radio signal needs to pass through the multilayer printed circuit board 10. Hence, the multilayer printed circuit board 10 has a structure in which an electromagnetic wave transmitted and received by the antenna 30 is not blocked. Specifically, in the present embodiment, at least part of the conductive layers L2 and L3 serves as a blank region S that is in a state in which the conductive materials are removed.

The blank region S may be a region overlapping with the antenna 30 as seen from the front side of the electronic device 1. However, the conductive materials in the blank region S are not all removed, and there are some regions in such an island shape that the conductive materials remain interspersed in a plurality of positions in the blank region S. In the following, individual regions including the conductive materials in the blank region S are referred to as island regions A.

Each of the island regions A is entirely surrounded by the insulating material in plan view, is not connected to other regions formed of conductive materials in the conductive layer L2, such as other island regions A, and is electrically isolated. Accordingly, all the island regions A are not connected to a ground of a circuit and are in a floating state having an independent potential from other components.

A plurality of the island regions A are disposed to be apart from one another at a substantially fixed distance in a dispersed manner. Specifically, in an example of FIG. 3, the plurality of the island regions A are disposed in a grid manner at a substantially equal interval. More specifically, the plurality of the island regions A are arrayed in a straight line along both a predetermined first direction and a second direction intersecting the first direction. Note that these first and second directions may be orthogonal to each other and may be directions along an outer periphery of the multilayer printed circuit board 10 (that is, along a long side direction and a short side direction of the multilayer printed circuit board 10). In addition, the blank region S is a region of part of the multilayer printed circuit board 10, and in a case in which the blank region S has a substantially rectangular shape, the first and second directions may be directions along an outer periphery of the blank region S (that is, along a long side direction and a short side direction of the blank region S).

Note that, although the island regions A are assumed to be disposed in a grid manner here, the layout of the island regions A are not limited to this. For example, in a case in which there are present a plated through hole, a non-plated through hole, and the like in the blank region S and the island regions A disposed at an equal interval overlap with such through holes or the like, each of the island regions A may be disposed at a shifted position in such a manner as not to overlap with one another. In the example depicted in FIG. 3, the island regions A are disposed around a through hole T, avoiding the through hole T. In addition, the island regions A may be disposed not only in a grid manner, but also in various types of modes, for example, side by side or randomly.

At a time of manufacturing the multilayer printed circuit board 10, the conductive layer L2 is formed over the entire front surface of the core member C with use of a conductive material. Then, from the conductive layer L2 formed by this conductive material, the conductive material inside the blank region S is removed by etching, with the plurality of island regions A being left therein. Thereafter, such an insulating material as a prepreg is disposed above the conductive layer L2 to be pressurized, heated, and the like, thereby forming the insulating layer P1 that covers the conductive layer L2. At this time, the insulating material in a liquid state flows into the blank region S from which the conductive material is removed and fills the blank region S. Here, the island regions A are disposed in the blank region S, so that flow of the insulating material is dispersed, thereby preventing the flow of the insulating material from getting faster. Accordingly, it is possible to prevent wrinkles from being generated in the insulating layer P1 and to form the insulating layer P1 having a uniform surface.

For preventing generation of wrinkles in the insulating layer P1, it is preferred that the island regions A be disposed uniformly as much as possible such that a distance between adjacent ones of the island regions A does not become too large and that no portion apart from any one of the island regions A exist in the blank region S. Specifically, for example, in a case in which an average value of the distances from each of the island regions A to a closest island region A (an adjacent island region A) is set as rm, the island regions A are disposed evenly such that a point at which the distance to the closest island region A exceeds rm does not exist in the blank region S. In other words, a region in which no island region A is included in a circular region having a radius of rm should not be included in the blank region S. In such a manner, the plurality of island regions A are evenly disposed in the blank region S with a predetermined interval to some extent, and accordingly, when the insulating material is filled in the blank region S to form the insulating layer P1 that covers the conductive layer L2, the flow of the insulating material is dispersed, so that the insulating layer P1 is less likely to be wrinkled.

Since each of the island regions A is formed by the conductive material, the radio signal that is transmitted and received by the antenna 30 cannot pass through the region that is occupied by the island region A. Accordingly, it is preferred that the region that is occupied by the island region A be sufficiently small relative to the entire blank region S.

Further, in order not to interfere with propagation of the radio signal that is received and transmitted by the antenna 30, each of the island regions A preferably has such a size as not to resonate with the frequency of the radio signal that is transmitted and received by the antenna 30. Specifically, when a wavelength of an electromagnetic wave that is subject to wireless communication performed by the antenna 30 is set as λ, an electrical length L in the multilayer printed circuit board 10 that corresponds to the wavelength of the electromagnetic wave is calculated with the following calculating formula:

$$L = \lambda/\sqrt{\varepsilon}$$

Here, ε is a relative dielectric constant of the insulating layer P1.

It is preferred that the size of each of the island regions A (a length from one end to the other end thereof in the longest orientation) be sufficiently small relative to the electrical length L corresponding to the wavelength of this electromagnetic wave. Specifically, the size of each of the island regions A is preferably smaller than L/4, more preferably equal to or smaller than L/10. In such a manner, by setting the size of each of the island regions A relatively smaller than the electrical length L, it is possible to cause a conductor included in each of the island regions A not to resonate with the radio signal that is received and transmitted by the antenna 30, so that it is possible to prevent each of the island regions A from interfering with the wireless communication by the antenna 30.

Note that, although each of the island regions A has a circular shape in the example depicted in FIG. 3, as long as a condition regarding the size described above is satisfied, the shape of the island region A in plan view is not limited to this, and various shapes are adoptable. In addition, the plurality of island regions A may have shapes different from one another.

In the above description, the island regions A are assumed to be disposed in a substantially evenly dispersed manner in the blank region S. However, in a particular region, the island regions A may be disposed more densely than other regions. Specifically, for example, in the first place, the radio signal cannot pass through a region in which a signal wire is disposed in each of the conductive layer L1 and the conductive layer L4, a region in which a metal circuit component is mounted on the front surface of the multilayer printed circuit board 10, or the like, and accordingly, an effect on the radio signal is small at a position overlapping with these regions, even if the conductive materials remain inside the conductive layers L2 and L3. In view of this, the island regions A may be disposed more densely in such regions than the other regions. Hereinafter, the region in which the island regions A are disposed more densely than the other regions in the blank region S is referred to as a concentration region X. Here, that the island regions A are disposed densely means that a proportion of an area of the island regions A relative to the same unit area is large. For example, in the concentration region X, the island regions A are assumed to be disposed such that the proportion of the area of the island regions A in the concentration region X becomes at least twice the proportion of the area of the island regions A in the other regions.

Note that, as described above, since the island regions A each become such a floating state as to be electrically independent, when the size of each island region A is large, each island region A may resonate with the radio signal. Accordingly, even in the concentration region X, it is preferred that the size of each of the island regions A to be disposed be made sufficiently small relative to the electrical length L.

Figure 4:
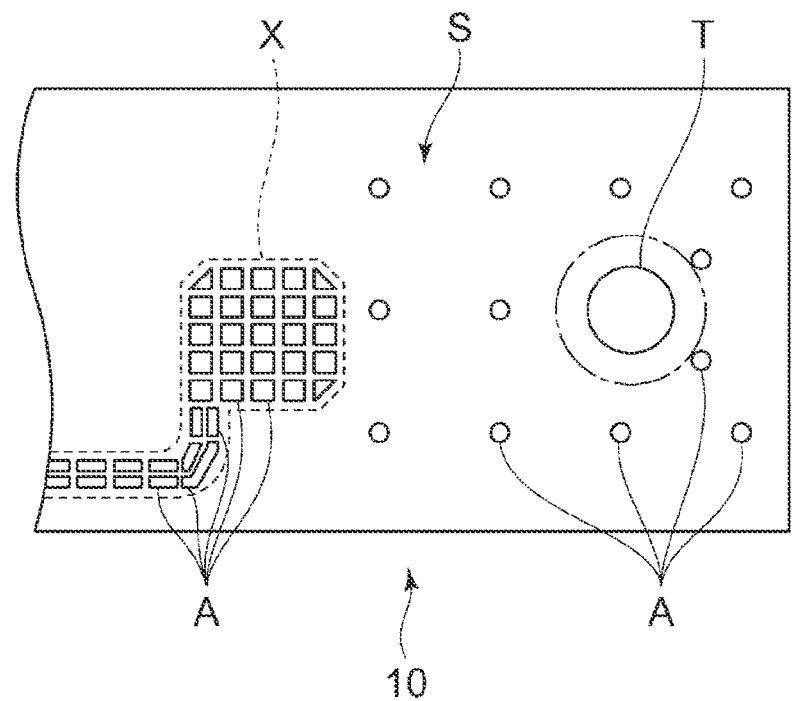
FIG. 4 is a plan view illustrating another example of the conductive layer inside the multilayer printed circuit board according to the embodiment of the present invention.

FIG. 4 illustrates an example of the conductive layer L2 having the concentration region X in which the island regions A are densely disposed in such a manner described above. In this figure, the concentration region X in which the plurality of island regions A are disposed densely are illustrated with a broken line. The concentration region X in this figure is a region overlapping with the signal wire formed in the conductive layer L1 and the circuit components (operation button 11 and the like) connected to this signal wire, in plan view. In the concentration region X, compared to the other regions, a distance between adjacent ones of the island regions A becomes small. Disposing the island regions A densely in such a manner makes it more difficult to cause wrinkles in the insulating material upon forming the insulating layer P1. Note that, regarding the average value rm of the distances between adjacent ones of the island regions A, the island regions A disposed in such a concentration region X are not included, and it is preferable to calculate an average value rm of distances between adjacent ones of the island regions A in the regions other than the concentration region X.

Note that, although the layout of the island regions A in the conductive layer L2 has been described so far, the island regions A may be disposed in the blank region S also in the conductive layer L3 in the similar way of thinking. Moreover, in a case in which the island regions A are disposed in the conductive layer L3, it is preferable to dispose the island regions A in the conductive layer L3 at such corresponding positions as to overlap with the island regions A in the conductive layer L2, in plan view. As a result, in plan view, it is possible to prevent a region in which the radio signal from the antenna 30 is interfered from being increased and to dispose the island regions A also in the conductive layer L3.

The blank region S may be a partial region of the multilayer printed circuit board 10 and may be a region covering the entire surface of the multilayer printed circuit board 10 that is to be mounted in the electronic device 1. In a case in which a printed circuit board is manufactured, a plurality of printed circuit boards are manufactured all at once by a manufacturing method called panelizing or the like, in some cases. In this manufacturing method, first, a conductive layer and an insulating layer are stacked over the core member C having a large size to form a multilayer printed circuit board panel 50, and by partially cutting out the multilayer printed circuit board panel 50, a plurality of printed circuit boards to be mounted in an electronic device in actual use are manufactured. In a case in which the multilayer printed circuit board 10 to be mounted in the electronic device 1 is manufactured in such a method described above, depending on a specification of a printed circuit board of other type that is manufactured at the same time, even if the multilayer printed circuit board 10 does not need to have the conductive layer L2 and the conductive layer L3 inside, these layers are formed therein. In such a case, with the region covering the entire surface of the multilayer printed circuit board 10 set as the blank region 10, the conductive material is removed from the blank region S of each of the conductive layer L2 and the conductive layer L3. Also in such a case, in order to restrict flow of an insulating material when the insulating layer P1 is formed in the manufacturing procedure of the multilayer printed circuit board panel 50, it is preferred that the plurality of island regions A be formed in the blank region S.

Figure 5:
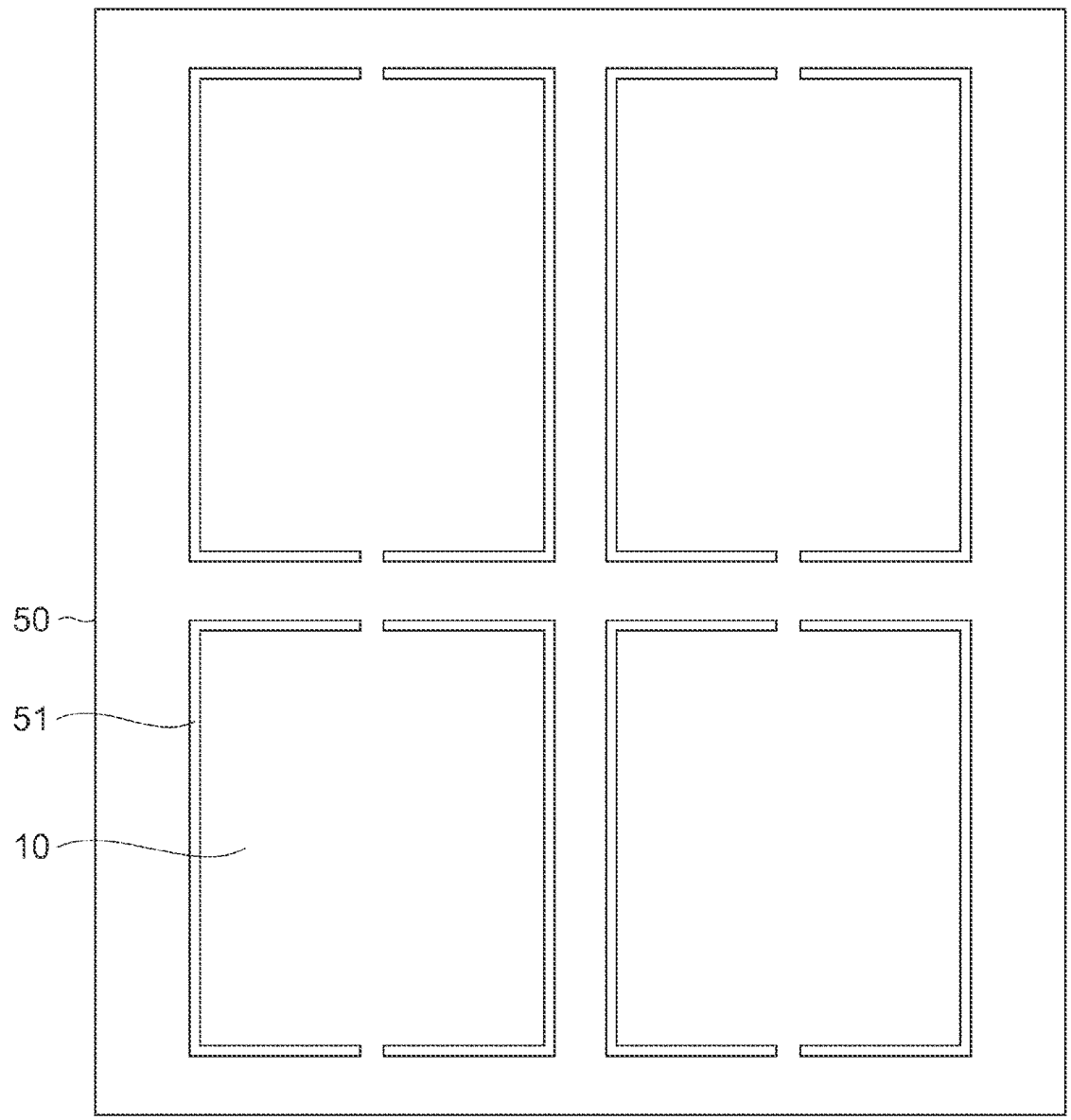
FIG. 5 is a plan view illustrating an example of a multilayer printed circuit board panel.

FIG. 5 illustrates an example of the multilayer printed circuit board panel 50 to be formed in a procedure of manufacturing the multilayer printed circuit board 10, by this panelizing manufacturing method. In the example depicted in this figure, four printed circuit boards including the multilayer printed circuit board 10 in the multilayer printed circuit board panel 50 are formed. Here, along an outer periphery of each of the multilayer printed circuit boards, a slit 51 that penetrates the multilayer printed circuit board panel 50 except for some connecting points is provided by a router or the like. After that, each of the multilayer printed circuit boards is separated from the multilayer printed circuit board panel 50 along the slit 51.

Figure 6:
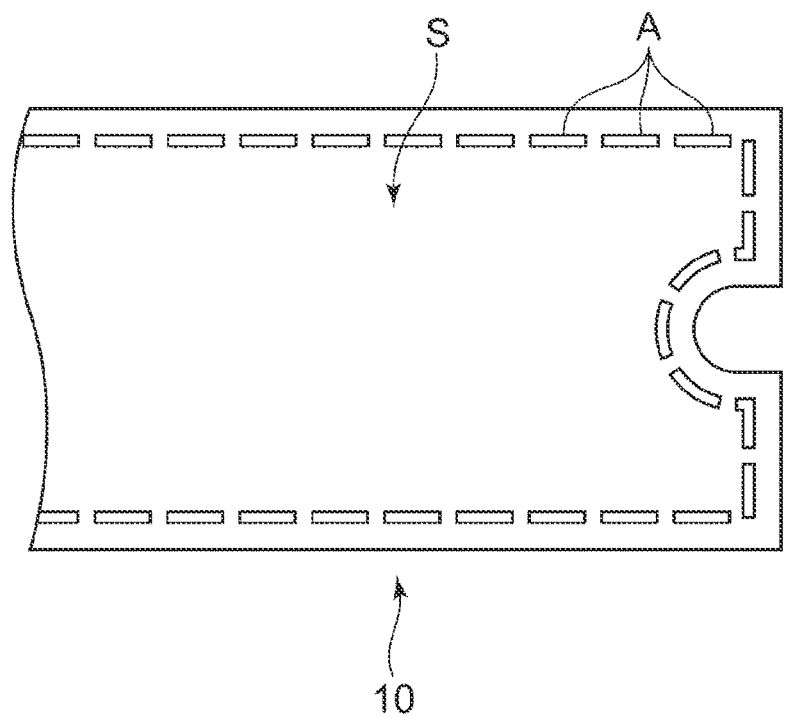
FIG. 6 is a plan view illustrating yet another example of the conductive layer inside the multilayer printed circuit board according to the embodiment of the present invention.

In this example, in a case in which the entire surface of each of the multilayer printed circuit boards 10 is set as the blank region S, the island regions A may be disposed along an inner periphery of the blank region S. FIG. 6 illustrates an example of this case, and the island regions A each having an elongated stripe shape are disposed adjacent to one another along an inner periphery of the multilayer printed circuit board 10 (that is, along an inner periphery of the blank region S). By disposing such island region A, when the insulating layer P1 is formed in the multilayer printed circuit board panel 50, it is possible to restrict the flow of the insulating material from the outer side of the blank region S toward the inner side. Note that, although illustration is omitted in this figure, also in this case, in addition to the island regions A disposed along the outer periphery of the blank region S, the island regions A that are dispersed like the ones illustrated in FIG. 3 or other figures may be disposed in the blank region S.

Figure 7:
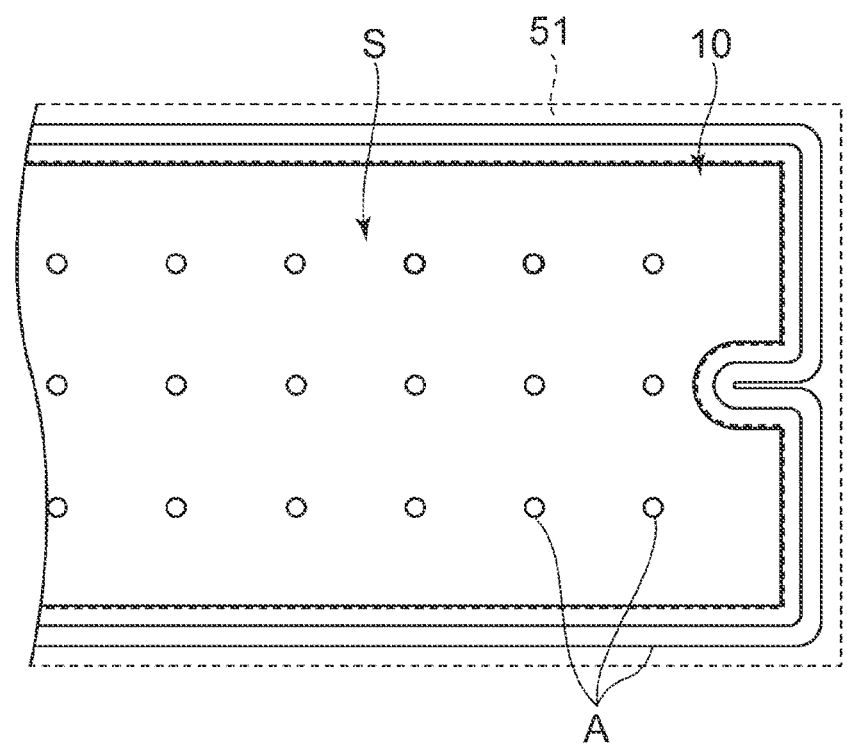
FIG. 7 is a plan view illustrating still another example of the conductive layer inside the multilayer printed circuit board according to the embodiment of the present invention.

Moreover, when the multilayer printed circuit board panel 50 is manufactured, the island regions A may be disposed in a region formed with the slit 51. Since the slit 51 is positioned outside the multilayer printed circuit board 10 and is not used in the electronic device 1 in a final product, there is no need to restrict the size of the island region A to the size corresponding to the electrical length L in the region corresponding to the slit 51. Hence, one island region A that surrounds the entirety of the outer periphery of the multilayer printed circuit board 10 along the outer periphery of the multilayer printed circuit board 10 may be formed. FIG. 7 illustrates a specific example of such an island region A and illustrates an example of the island regions A formed in the region including the multilayer printed circuit board 10 and the slit 51 around the multilayer printed circuit board 10, the slit 51 being separated therefrom in the end.

As has been described above, according to the electronic device 1 according to the present embodiment, the island regions A are disposed in the blank region S, so that wrinkles are not generated in the insulating layers P1 and P2 and the blank region S in which the conductive material is removed can be secured in the conductive layers L2 and L3 inside the multilayer printed circuit board 10.

Note that the embodiment of the present invention is not limited to those described above. For example, the shape and the layout of the island regions A in the above description are merely examples, and the island regions A may be formed in various shapes and layouts, depending on an entire shape of the multilayer printed circuit board 10 and the layout of the signal wire, the circuit component, the through holes, and the like.

In addition, in the description mentioned above, the multilayer printed circuit board 10 is a printed circuit board having four layers. However, the multilayer printed circuit board 10 is not limited to this, and as long as the multilayer printed circuit board 10 is a printed circuit board having conductive layers inside, it is possible to apply the present invention to various types of multilayer printed circuit board.

In addition, in the description mentioned above, the blank region S is provided in the multilayer printed circuit board 10 in order to allow for transmission and reception of the radio signal by the antenna 30, but the present invention is not limited to this. The present invention is applicable to a case in which the blank region S is provided in a conductive layer inside the multilayer printed circuit board 10 because of various other reasons.

REFERENCE SIGNS LIST

1: Electronic device
10: Multilayer printed circuit board
11: Operation button
20: Main board
30: Antenna
50: Multilayer printed circuit board panel
51: Slit
L1, L2, L3, L4: Conductive layer
P1, P2: Insulating layer
C: Core member

The invention claimed is:

1. A multilayer printed circuit board comprising:
a plurality of conductive layers formed by a conductive material, wherein
a blank region with the conductive material removed is formed in at least part of at least one intermediate conductive layer that is formed inside the multilayer printed circuit board, among the plurality of conductive layers,
a plurality of island regions are formed by the conductive material included in the intermediate conductive layer in the blank region,
each of the plurality of island regions is not electrically connected to other regions included in the intermediate conductive layer and is disposed so as to be dispersed from one another, and
wherein part of a concentration region among the blank region is formed with the plurality of island regions more densely than regions other than the concentration region.

2. The multilayer printed circuit board according to claim 1, wherein the concentration region includes a region overlapping with a region in which a signal wire is disposed in another conductive layer, in plan view.

3. The multilayer printed circuit board according to claim 1, wherein the concentration region includes a region overlapping with a circuit component that is disposed on a front surface of the multilayer printed circuit board, in plan view.

4. The multilayer printed circuit board according to claim 1, wherein the plurality of island regions include a plurality of island regions arrayed along an inner periphery of the blank region.

5. The multilayer printed circuit board according to claim 1, wherein the plurality of island regions include a plurality of island regions arrayed in a grid manner in the blank region.

6. An electronic device comprising:
a multilayer printed circuit board including
a plurality of conductive layers formed by a conductive material, in which a blank region with the conductive material removed is formed in at least part of at least one intermediate conductive layer that is formed inside the multilayer printed circuit board, among the plurality of conductive layers, a plurality of island regions are formed by the conductive material included in the intermediate conductive layer in the blank region, each of the plurality of island regions is not electrically connected to other regions included in the intermediate conductive layer and is disposed so as to be dispersed from one another, the electronic device includes an antenna for performing wireless communication, and each of the plurality of island regions is 1/4 smaller in size than an electrical length in the multilayer printed circuit board, the electrical length corresponding to a wavelength of the wireless communication.

7. The electronic device according to claim 6, wherein each of the plurality of island regions is 1/10 smaller in size than the electrical length.

8. An electronic device comprising:

a multilayer printed circuit board including a plurality of conductive layers formed by a conductive material, in which a blank region with the conductive material removed is formed in at least part of at least one intermediate conductive layer that is formed inside the multilayer printed circuit board, among the plurality of conductive layers, a plurality of island regions are formed by the conductive material included in the intermediate conductive layer in the blank region, each of the plurality of island regions is not electrically connected to other regions included in the intermediate conductive layer and is disposed so as to be dispersed from one another, and wherein part of a concentration region among the blank region is formed with the plurality of island regions more densely than regions other than the concentration region.

* * * * *